United States Patent
Hirabayashi et al.

(10) Patent No.: US 7,187,559 B2
(45) Date of Patent: Mar. 6, 2007

(54) CIRCUIT BOARD DEVICE AND ITS MANUFACTURING METHOD

(75) Inventors: Takayuki Hirabayashi, Tokyo (JP); Akihiko Okubora, Kanagawa (JP)

(73) Assignee: Sony Corporation, Tokyo (JP)

( * ) Notice: Subject to any disclaimer, the term of this patent is extended or adjusted under 35 U.S.C. 154(b) by 336 days.

(21) Appl. No.: 10/467,473

(22) PCT Filed: Dec. 4, 2002

(86) PCT No.: PCT/JP02/12723

§ 371 (c)(1),
(2), (4) Date: Aug. 8, 2003

(87) PCT Pub. No.: WO03/050909

PCT Pub. Date: Jun. 19, 2003

(65) Prior Publication Data

US 2004/0066617 A1 Apr. 8, 2004

(30) Foreign Application Priority Data

Dec. 13, 2001 (JP) ............................. 2001-380758

(51) Int. Cl.
*H05K 1/16* (2006.01)
*H05K 7/06* (2006.01)

(52) U.S. Cl. ...................... 361/780; 361/783; 361/794; 333/185; 333/247; 257/700; 29/830; 438/125

(58) Field of Classification Search .................... None
See application file for complete search history.

(56) References Cited

U.S. PATENT DOCUMENTS

| | | | | |
|---|---|---|---|---|
| 5,136,271 A | * | 8/1992 | Nishioka et al. | 333/246 |
| 5,387,888 A | * | 2/1995 | Eda et al. | 333/247 |
| 5,450,046 A | * | 9/1995 | Kosugi et al. | 333/246 |
| 5,796,165 A | * | 8/1998 | Yoshikawa et al. | 257/728 |
| 5,929,510 A | * | 7/1999 | Geller et al. | 257/635 |
| 6,225,878 B1 | * | 5/2001 | Takahashi et al. | 333/204 |
| 6,476,463 B1 | * | 11/2002 | Kaneko et al. | 257/660 |

FOREIGN PATENT DOCUMENTS

JP 6-291520 A 10/1994

* cited by examiner

*Primary Examiner*—John B. Vigushin
(74) *Attorney, Agent, or Firm*—Robert J. Depke; Rockey, Depke, Lyons & Kitzinger LLC.

(57) ABSTRACT

This invention is a circuit board device having a filter element. It has a base board (4), a circuit part (2) mounted on the base board (4), a filter element (5) arranged between the circuit part (2) and the base board (4), and a semiconductor component (3) mounted on the same plate as the circuit part (2) on the base board (4). The semiconductor component (3) is mounted on a thin plate region (17) that is thinner than a thick plate region (16) having its thickness increased by mounting the circuit part (2) on the base board (4). Thus, the thickness of the whole circuit board device is reduced and the filter element (5) is covered with a sufficiently thick dielectric insulating material so as to prevent deterioration in filter characteristic.

4 Claims, 12 Drawing Sheets

CIRCUIT BOARD DEVICE AND ITS MANUFACTURING METHOD

TECHNICAL FIELD

This invention relates to a circuit board device having a filter element and a method for manufacturing the same.

This application claims priority of Japanese Patent Application No.2001-380758, filed on Dec. 13, 2001, the entirety of which is incorporated by reference herein.

BACKGROUND ART

Recently, in high-frequency applications using a microwave band or a milliwave band as a carrier, for example, in wireless LAN or various communication terminals, reduction in size and thickness of equipment and circuit board has been demanded. In a circuit board for such high-frequency applications, filter elements such as a low-pass filter (LPF), a high-pass filter (HPF) and a band-pass filter (BPF) are designed with a distributed constant, for example, using a microstrip line or a strip line that enables relatively high space-saving, instead of using a lumped constant design using chip components like an inductor and a capacitor.

Figure 1:
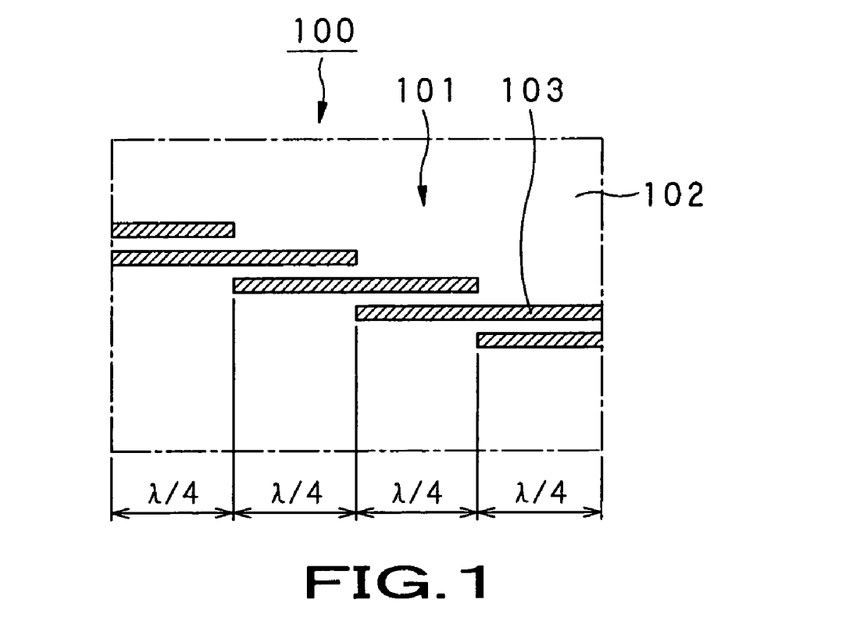
FIG. 1 is a schematic plan view showing a circuit board having a band-pass filter of a flat structure.

For example, a circuit board 100 shown in FIG. 1 has a BPF 101 of a flat structure, as a filter element designed with a distributed constant. In this circuit board 100, conductor patterns 103 made of copper or nickel plated with gold are formed as microstrip lines on a dielectric board 102 such as a printed board or a ceramic board, thus constituting the BPF 101. On the entire back side of the dielectric board 102, a ground part (not shown) is formed.

With such a BPF 101, it is possible to selectively transmit a signal of a desired frequency band by optimizing the shape of the conductor patterns 103. Since this BPF 101 is a part of the whole pattern wiring formed on the dielectric board 102 and has a flat structure, the BPF 101 can be collectively formed when forming the pattern wiring on the dielectric board 102, for example, by print processing, lithography processing or the like.

In the circuit board 100 shown in FIG. 1, since the BPF 101 has a flat structure and the conductor patterns 103 are arrayed with an overlap of substantially ¼ of a passing wavelength $\lambda$, the length of the conductor patterns 103 is prescribed by the passing wavelength $\lambda$. In the circuit board 100, the conductor patterns 103 need to have a certain length and it is difficult to reduce the occupied area of the conductor patterns 103. Therefore, area-saving is limited.

Thus, in a circuit board 110 shown in FIGS. 2A to 2D, it is proposed to save the area by using a BPF 111 as a filter element that requires a smaller occupied area. This BPF 111 has a so-called tri-plate structure, which is a three-layer structure in which resonator conductor patterns 113 arranged substantially parallel to each other are formed in an inner layer of a multilayer board 112 such as a multilayer printed board.

Figure 2A:
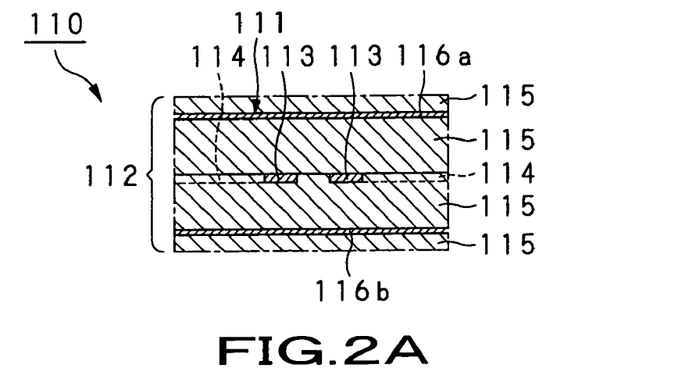
FIG. 2A is a partly perspective longitudinal sectional view of the circuit board.
Figure 2B:
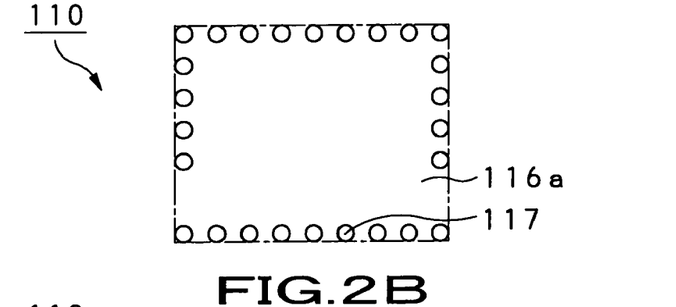
FIG. 2B is a plan view showing a ground part of an upper layer.
Figure 2C:
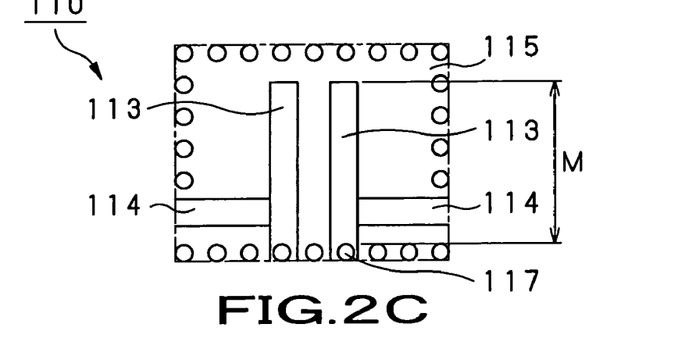
FIG. 2C is a plan view showing conductor patterns.
Figure 2D:
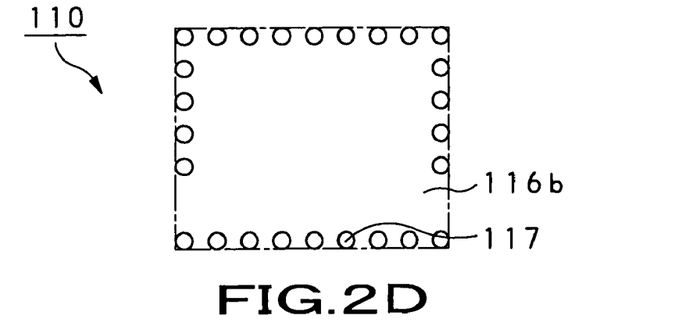
FIG. 2D is a plan view showing a ground part of a lower layer.
Figure 3:
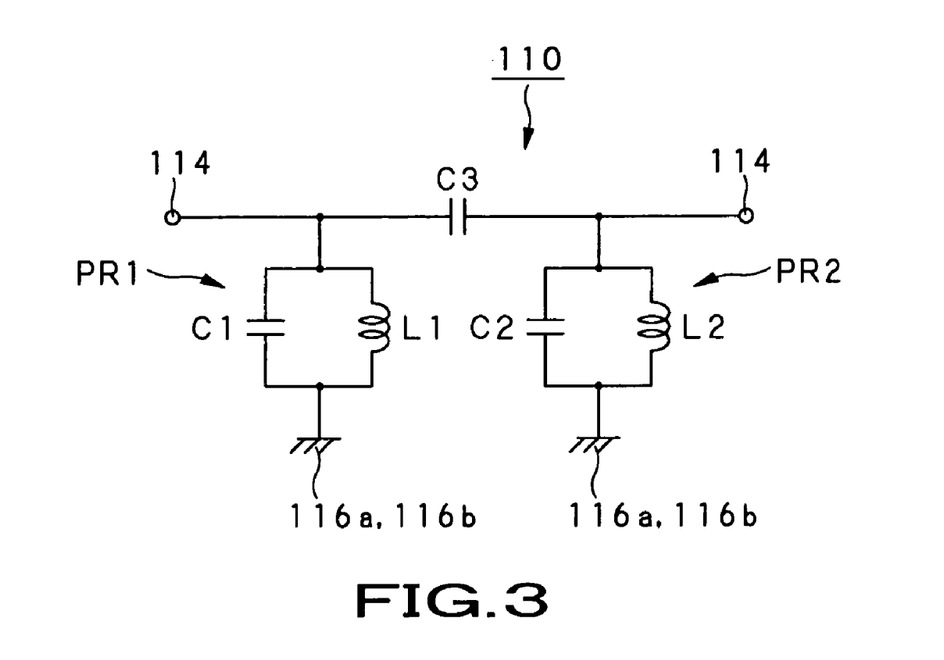
FIG. 3 is a circuit diagram showing the band-pass filter of the tri-plate structure in the form of an equivalent circuit.

Specifically, in the BPF 111, feeder wirings 114 are connected to substantially central parts in the longitudinal direction of the two resonator conductor patterns 113, as shown in FIG. 2C. The resonator conductor patterns 113 are held between two ground parts 116a, 116b as ground conductors, with dielectric layers 115 provided between the resonator conductor patterns 113 and the ground parts 116a, 116b, as shown in FIG. 2A. In this BPF 111, the two ground parts 116a, 116b are connected with each other in the form of interlayer connection by via-holes 117 and shield the resonator conductor patterns 113 in the layer. In the BPF 111, each of the two resonator conductor patterns 113 has a length that is substantially ¼ of the passing wavelength A, indicated by an arrow M in FIG. 2C. One end of each resonator conductor pattern 113 is connected to the via-hole 117 and the other end is opened. In this BPF 111, when shown in the form of an equivalent circuit as shown in FIG. 3, parallel resonance circuits are capacitive-coupled. Specifically, a parallel resonance circuit PR1 including a capacitor C1 and an inductance L1 connected between one of the two resonator conductor patterns 113 and the ground parts 116a, 116b, and a parallel resonance circuit PR2 including a capacitor C2 and an inductance L2 connected between the other of the two resonator conductor patterns 113 and the ground parts 116a, 116b, are capacitive-coupled via a capacitor C3.

Figure 4:
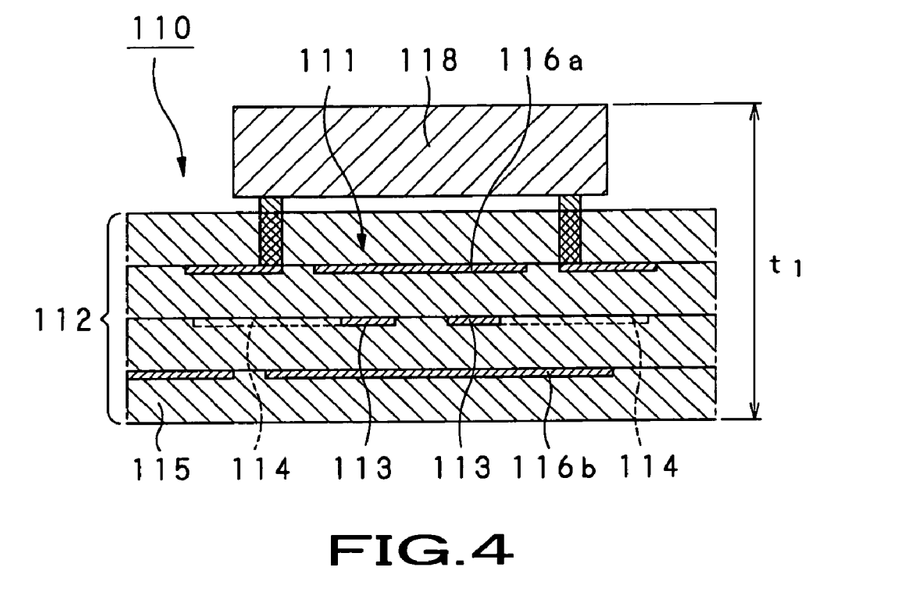
FIG. 4 is a partly perspective longitudinal sectional view showing a conventional circuit board.

Meanwhile, in the above-described circuit board 110, it is possible to reduce the area of whole body by reducing the occupied area of the filter element. However, when a semiconductor component 118 such as an IC or a chip component is mounted on the major surface, as shown in FIG. 4, the thickness of the whole body indicated by an arrow $t_1$ in FIG. 4 is increased.

Figure 5:
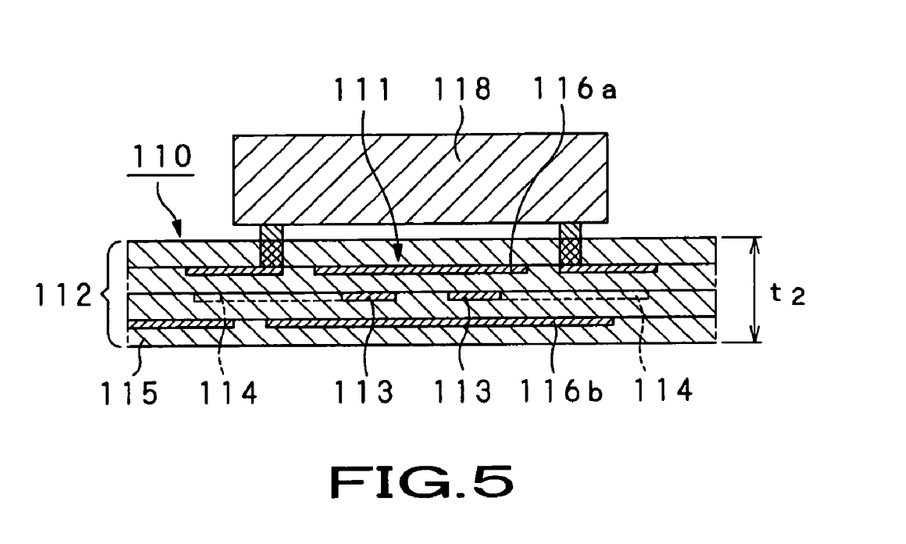
FIG. 5 is a partly perspective longitudinal sectional view showing the state where the thickness is reduced in the conventional circuit board.

To solve this problem, it is proposed to reduce the thickness of the circuit board 110 indicated by an arrow $t_2$ in FIG. 5 and thus reduce the thickness of the whole body including the semiconductor component 118, as shown in FIG. 5.

To realize the reduction in thickness of the semiconductor component, the present applicant has proposed the techniques described in the Japanese Publications of Laid-pen Patent Application Nos.2001-44704, 2001-44705 and 2001-44706. According to the technique described in these publications, if the thickness of the circuit board 110 is reduced, that is, if the thickness of the dielectric board 115 is reduced, the degree of electromagnetic coupling between the resonator conductor patterns 113 might not be sufficient, which affects the passing characteristic at the time when an electric signal passes through the BPF 111. Therefore, in the circuit board 110 with the reduced thickness, the loss within the passband of the BPF 111 is increased and the frequency bandwidth is reduced, making it difficult to acquire a desired filter characteristic.

DISCLOSURE OF THE INVENTION

It is an object of the present invention to provide a new circuit board device and a method for manufacturing the same that enable solution to the problem of the conventional circuit board device as described above.

It is another object of the present invention to provide a circuit board device in which the thickness of its whole body is reduced without losing the filter characteristic of a filter element, and a method for manufacturing the same.

A circuit board device according to the present invention includes: a base board having an insulating layer made of a dielectric insulating material; a circuit part including a wiring layer and a dielectric insulating layer and mounted on a major surface of the base board; a filter element arranged between the base board and the circuit part; and a semiconductor component mounted on the same plane as the circuit part mounted on the major surface of the base board; the semiconductor component being mounted on a second region having a thickness smaller than that of a first region having a large thickness as the filter element is arranged between the base board and the circuit part on the major surface of the base board.

In this circuit board device, since the semiconductor component is mounted on the second region having a thickness smaller than that of the first region having a large thickness as the filter element is arranged between the base board and the circuit part on the major surface of the base board, the thickness of the whole body is small.

In the circuit board device, since the filter element is arranged between the base board and the circuit part, that is, within the first region with a large thickness, and these base board and circuit part have dielectric insulating layers, the filter element can be covered with the sufficiently thick dielectric insulating layers. As the dielectric insulating layers covering the filter element are made thinner, deterioration in filter characteristic is prevented.

A method for manufacturing a circuit board device according to the present invention includes: a board forming step of forming a base board having an insulating layer made of a dielectric insulating material; a circuit part forming step of forming a circuit part including a wiring layer and a dielectric insulating layer; an element forming step of forming a filter element on a major surface of the base board or a major surface of the circuit part; a circuit part mounting step of mounting the circuit part on the major surface of the base board so that the filter element is arranged between the base board and the circuit part; and a semiconductor mounting step of mounting a semiconductor component on the same plane as the circuit part mounted on the major surface of the base board; wherein at the semiconductor mounting step, the semiconductor component is mounted on a second region having a thickness smaller than that of a first region having a large thickness as the filter element is arranged between the base board and the circuit part on the major surface of the base board.

In this method for manufacturing a circuit board device, since the semiconductor component is mounted on the second region having a thickness smaller than that of the first region having a large thickness as the filter element is arranged between the base board and the circuit part on the major surface of the base board, a circuit board device having a small thickness as a whole is manufactured.

In the method for manufacturing a circuit board device, since the filter element is arranged between the base board and the circuit part, and these base board and circuit part have dielectric insulating layers, the filter element can be covered with the sufficiently thick dielectric insulating layers. As the dielectric insulating layers covering the filter element are made thinner, deterioration in filter characteristic is prevented.

The other object of the present invention and specific advantages provided by the present invention will be further clarified by the following description of an embodiment referring to the drawings.

BRIEF DESCRIPTION OF THE DRAWINGS

FIGS. 2A to 2D show a circuit board having a band-pass filter of a tri-plate structure.

BEST MODE FOR CARRYING OUT THE INVENTION

An embodiment of the present invention will now be described in detail with reference to the drawings.

Figure 6:
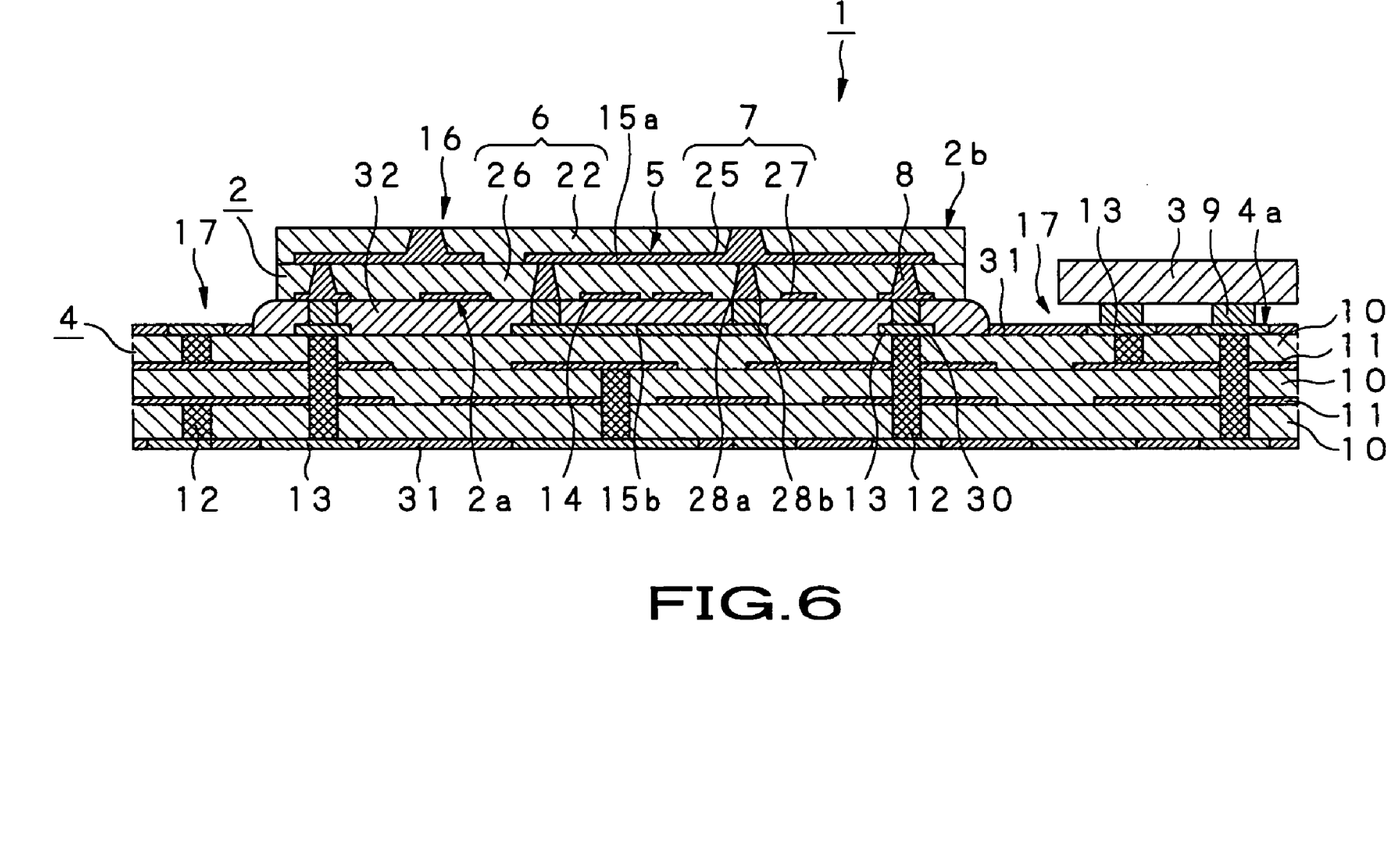
FIG. 6 is a longitudinal sectional view showing a circuit board device according to the present invention.
Figure 7:
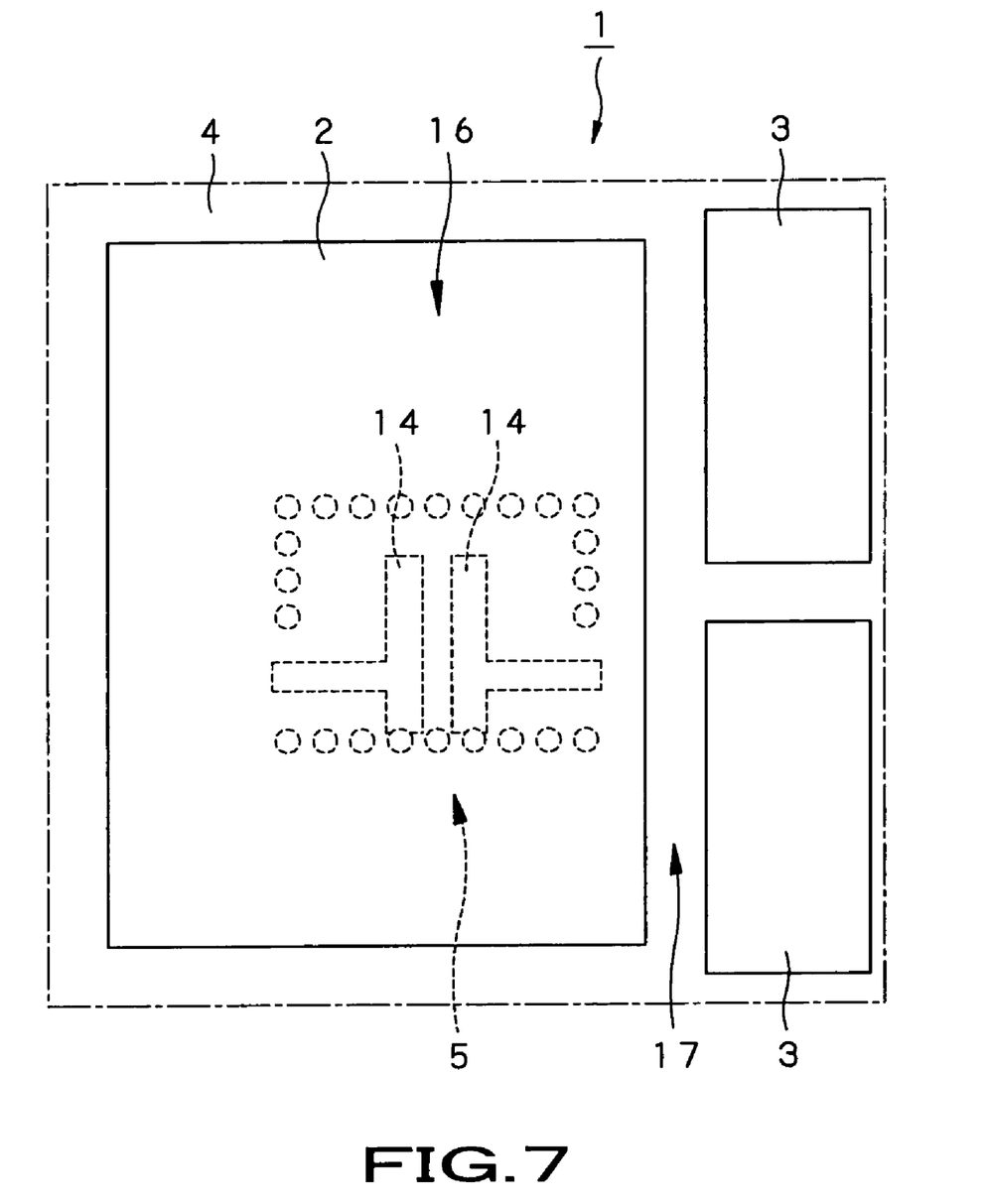
FIG. 7 is a partly perspective schematic plan view showing the circuit board device.

A circuit board device 1 to which the present invention is applied, shown in FIGS. 6 and 7, constitutes a high-frequency circuit used in a transmitting/receiving unit provided in a portable communication terminal device or the like and adapted for processing a high-frequency signal. The circuit board device 1 has a structure in which a circuit part 2 and a semiconductor component 3 are electrically connected to and mounted on a major surface (hereinafter referred to as mounting surface) 4a of a base board 4, for example, by a flip-chip bonding method using solder, and a filter element 5 is arranged between the circuit part 2 and the base board 4.

The circuit part 2 is constructed as plural insulating layers 6 made of a dielectric insulating material and plural patterned wiring layers 7 are alternately stacked. Electric interlayer connection is made by a via-hole 8 penetrating all the plural wiring layers 7 or penetrating the upper and lower layers.

As will be later described in detail, the circuit part 2 is formed as the insulating layers 6 and the wiring layers 7 are sequentially stacked via a peeling layer 21 on a dummy board 20 having a flat major surface and are peeled from the dummy board 20 by the peeling layer 21. Therefore, the structure of the circuit part 2 need not use a core board such as a glass board or an Si board. The dummy board 20 is reused when necessary.

In the circuit part 2, the insulating layers 6 are made of a dielectric insulating material having low Tanδ at a low dielectric constant, that is, having an excellent high-frequency characteristic. Specifically, a mixture of an organic material such as polyphenylene ether (PPE), bismaleidetriazine (BT-resin), polytetrafluoroethylene, polyimide, liquid crystal polymer (LCP), polynorbornene (PNB), phenol resin, or polyolefin resin, and an inorganic material such as ceramics, or a mixture of an organic material such as glass epoxy and an inorganic material is used.

The wiring layers 7 forming the circuit part 2 are pattern wirings formed by conductors made of, for example, copper or nickel plate with gold. The wiring layers 7 are formed, for example, by print processing or lithography processing.

The semiconductor component 3 is a functional circuit element such as a semiconductor chip or an LSI (large-scale integrated circuit) chip and is mounted on the mounting surface 4a of the base board 4, for example, by a flip-chip bonding method using an element bump part 9. This semiconductor component 3 is mounted on the same plate as the circuit part 2 mounted on the mounting surface 4a of the base board 4, that is, parallel to the circuit part 2 on the base board 4.

The base board 4 has a structure in which plural insulating layers 10 and plural wiring layers 11 are alternately stacked, and interlayer connection is made by a via-hole 12 penetrating all the plural wiring layers 11 or penetrating plural layers of them. The base board 4 has plural input/output terminal parts 13 on its front and back major surfaces. These input/output terminal parts 13 function, for example, as connection terminals to an external power source, or as bases of electric connection parts for mounting the circuit part 2 and the semiconductor component 3. The plural wiring layers 11 provided in the base board 4 function as wirings for transmitting power, control signals and high-frequency signals supplied from the input/output terminal parts 13 to the circuit part 2 and also function as ground (ground electrodes).

In base board 4, similarly to the circuit part 2, a dielectric insulating material having low Tanδ at a low dielectric constant, that is, having an excellent high-frequency characteristic, is used for the insulating layers 10. Specifically, a mixture of an organic material such as polyphenylene ether (PPE), bismaleidetriazine (BT-resin), polytetrafluoroethylene, polyimide, liquid crystal polymer (LCP), polynorbornene (PNB), phenol resin, or polyolefin resin, and an inorganic material such as ceramics, or a mixture of an organic material such as glass epoxy and an inorganic material is used.

The wiring layers 11 provided in the base board 4, similar to those in the circuit part 2, are pattern wirings formed by conductors made of, for example, copper or nickel plate with gold. The wiring layers 11 are formed, for example, by print processing or lithography processing. The base board 4 is manufactured through a typical multilayer wiring board manufacturing process.

In the filter element 5, a pair of resonator conductor patterns 14 as a part of the wiring layers 7 are arranged to be exposed on a surface (hereinafter referred to as countersurface) 2a facing the mounting surface 4a of the base board 4 of the circuit part 2. Specifically, as the filter element 5, a BPF having a structure in which a ground part 15a provided in a part of the wiring layer 7 that is second from the mounting surface 4a of the base board 4 of the circuit part 2 and a ground part 15b provided in a part of the input/output terminal parts 13 exposed on the mounting surface 4a of the base board 4 shield the pair of resonator conductor patterns 14 exposed on the counter-surface 2a of the circuit part 2, that is, a so-called tri-plate structure, extends onto the circuit part 2 and the base board 4. This filter element 5 may be one of a low-pass filter (LPF), a high-pass filter (HPF) and a band-pass filter (BPF).

In the circuit board device 1 of this structure, the circuit part 2 is mounted on the mounting surface 4a of the base board 4 so that the circuit part 2 and base board 4 hold the pair of resonator conductor patterns 14 of the filter element 5. The thick part where the circuit part 2 is mounted on the base board 4 is a so-called thick plate region 16, whereas the part where the circuit part 2 is not mounted on the base board 4 and that is thinner than the thick plate region 16 is a thin plate region 17.

In this circuit board device 1, the semiconductor component 3 is mounted parallel to the circuit part 2 on the mounting surface 4a of the base board 4, that is, on the thin plate region 17. The thickness of the whole body including the semiconductor component 3 is made thin.

In the circuit board device 1, the resonator conductor patterns 14 of the filter element 5 are arranged in an inner layer of the thick plate region 16, that is, between the circuit part 2 and the base board 4, and the circuit part 2 and the base board 4 have the insulating layers 6 and 10 made of a dielectric insulating material over multiple layers. Thus, the resonator conductor patterns 14 of the filter element 5 can be covered with the sufficiently thick dielectric insulating material. Therefore, in the circuit board device 1, the thick dielectric insulating material covers the pair of resonator conductor patterns 14 of the filter element 5 and causes no deterioration in degree of electromagnetic coupling between the pair of resonator conductor patterns 14, thereby preventing deterioration in filter characteristic due to reduction in thickness of the dielectric insulating material covering the filter element 5.

In the circuit board device 1 to which the present invention is applied, since the circuit part 2, which is relatively expensive, is mounted only in a necessary part instead of the entire mounting surface 4a of the base board 4, reduction in cost is realized.

In the circuit board device 1 to which the present invention is applied, different dielectric insulating materials may be used for the insulating layers 6 and the insulating layers 10, respectively. For example, in the circuit board device 1, if a dielectric insulating material having a high dielectric constant is used for the insulating layers 10 of the base board 4, miniaturization is realized by reduction in size of the resonator conductor patterns 14 of the filter element 5. If a dielectric insulating material having a low dielectric constant is used for the insulating layers 10, the loss of parasitic capacitance in the filter element 5 can be reduced. In the circuit board device 1, if a head-resistant dielectric insulating material is used for the insulating layers 6 of the circuit part 2, a passive element such as a capacitor element, a register element, or an inductor element can be provided at a part of the wiring layers 7 of the circuit part 2.

A method for manufacturing the above-described circuit board device 1 will now be described.

Figure 8:
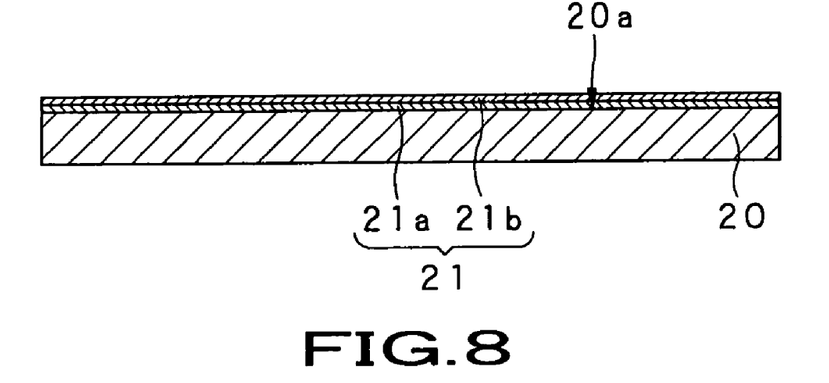
FIG. 8 is a longitudinal sectional view for explaining a process of manufacturing the circuit board device, showing a dummy board.

To manufacture the circuit board device 1, the circuit part 2 is formed first. When forming the circuit part 2, the dummy board 20 having the peeling layer 21 formed on its major surface 20a is prepared, as shown in FIG. 8. For the dummy board 20, for example, a glass board, a quartz board or a silicon board having high heat resistance and a highly flattened major surface is used. The peeling layer 21 includes a metal film 21a of copper, aluminum or the like deposited to a thickness of approximately 1000 Å evenly over the entire major surface 20a of the dummy board 20 by a sputtering method or a chemical vapor deposition (CVD) method, and a resin film 21b of polyimide resin or the like deposited to a thickness of approximately 1 to 2 μm over the entire metal film 21a by a spin coat method.

Figure 9:
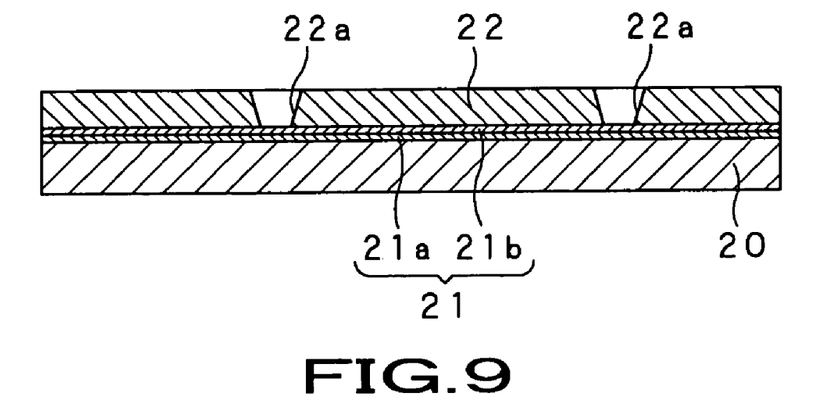
FIG. 9 is a longitudinal sectional view for explaining the process of manufacturing the circuit board device, showing the state where a first insulating layer is formed on the dummy board.

On the peeling layer 21, a first insulating layer 22 with an even thickness is formed, as shown in FIG. 9. The first insulating layer 22 is formed as a typically known dielectric insulating material as described above in the conventional wiring board manufacturing process is applied onto the peeling layer 21, for example, by a spin coat method, a curtain coat method, a roll coat method, a dip coat method or the like.

Next, in the first insulating layer 22, an aperture 22a to be the via-hole 8 is formed at a predetermined position by pattern processing. In the case a photosensitive dielectric insulating material is used for the first insulating layer 22, the aperture 22a is formed by patterning processing using a photolithography technique. In the case a non-photosensitive dielectric insulating material is used for the first insulating layer 22, the aperture 22a is formed by patterning processing based on dry etching or laser processing using a photoresist and a mask of aluminum or the like.

Figure 10:
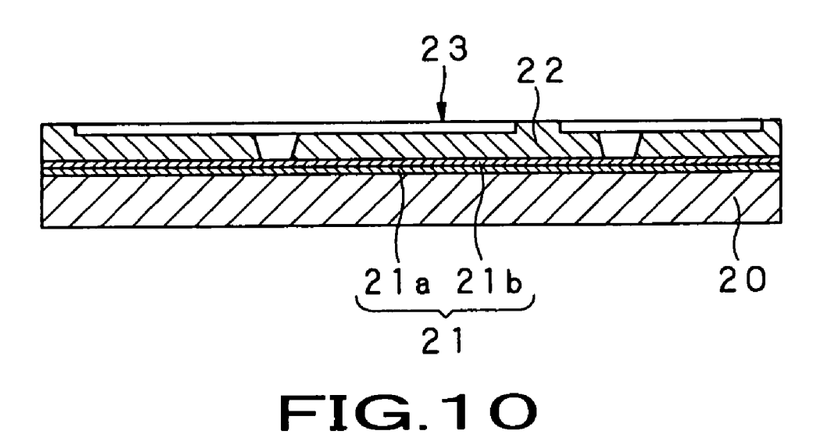
FIG. 10 is a longitudinal sectional view for explaining the process of manufacturing the circuit board device, showing the state where a wiring groove is formed in the first insulating layer.

Next, in the first insulating layer 22, a wiring groove 23 is formed by etching processing, as shown in FIG. 10. An etching mask having an aperture corresponding to the wiring groove 23 is formed on the first insulating layer 22, then dry etching using a reactive ion etching (RIE) method with oxygen plasma is performed in the region except for the etching mask on first insulating layer 22, and then the etching mask is removed. Thus, the wiring groove 23 is formed.

Figure 11:
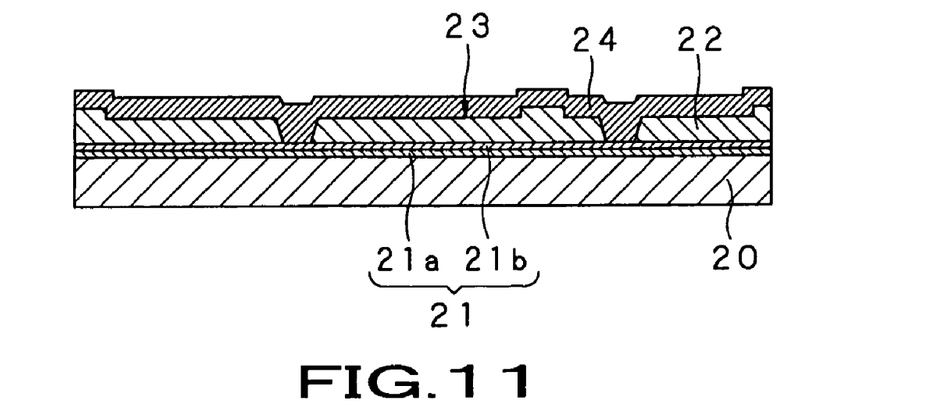
FIG. 11 is a longitudinal sectional view for explaining the process of manufacturing the circuit board device, showing the state where a metal plating layer is formed on the first insulating layer.

Next, on the first insulating layer 22 having the wiring groove 23 formed therein, a metal plating layer 24 is formed by metal plating processing, as shown in FIG. 11. The metal plating layer 24 is made of a highly conductive metal such as copper. The metal plating processing may be electroplating or electroless plating. The metal plating layer 24 fills the entire major surface of the first insulating layer 22 where the wiring groove 23 is formed and the aperture 22a, so that the thickest part of the metal plating layer 24 is thicker than the thickest part of the first insulating layer 22. When the metal plating layer 24 is formed by electroplating, the metal film 21a of the peeling layer 21 functions as a voltage applying electrode.

Figure 12:
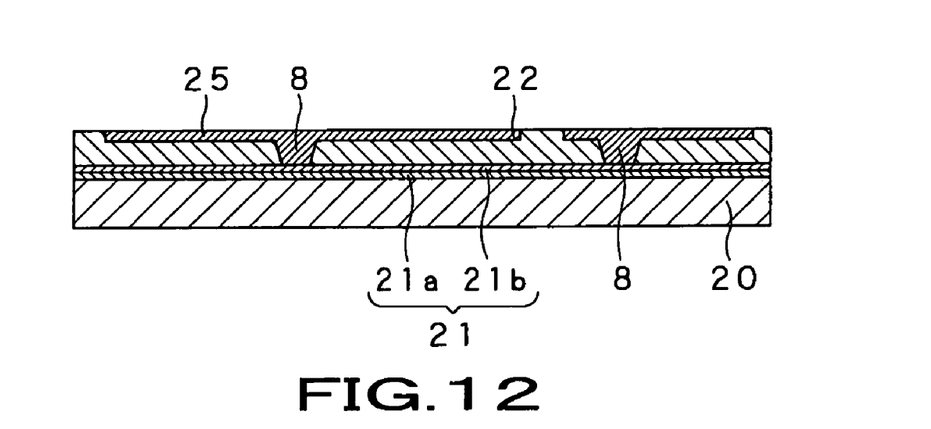
FIG. 12 is a longitudinal sectional view for explaining the process of manufacturing the circuit board device, showing the state where a first wiring layer is formed.

Next, as flattening processing of the metal plating layer 24 is performed until the first insulating layer 22 is exposed, a first wiring layer 25 embedded in the first insulating layer is formed on the major surface of the first insulating layer 22, as shown in FIG. 12. For the flattening processing, for example, a chemical-mechanical polishing (CMP) method is used in order to simultaneously polish the first insulating layer 22 and the metal plating layer 24, which are made of different materials. The CMP method enables polishing with material selectivity so as to increase the polishing rate of the metal plating layer 24 made of a metal such as copper, and realizes flattening of the polished surface with high accuracy. At this point, the ground part 15a arranged above the pair of resonator conductor patterns 14 of the filter element 5 is provided at a part of the first wiring layer 25.

Figure 13:
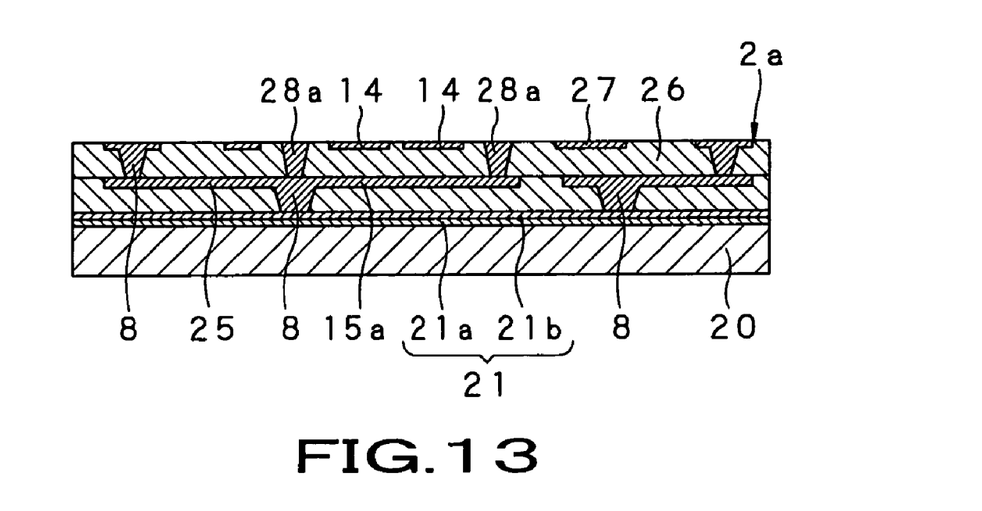
FIG. 13 is a longitudinal sectional view for explaining the process of manufacturing the circuit board device, showing the state where a second insulating layer and a second wiring layer are formed.

Next, a second insulating layer 26 and a second wiring layer 27 are stacked on the first insulating layer 22 having the first wiring layer 25 embedded therein, as shown in FIG. 13. These second insulating layer 26 and second wiring layer 27 are formed through a process similar to the process of forming the first insulating layer 22 and the first wiring layer 25, using materials similar to those of the first insulating layer 22 and the first wiring layer 25. At this point, at certain parts in the second wiring layer 27, the pair of resonator conductor patterns 14 of the filter element S, a first shield part 28a including plural via-holes as a shield surrounding the pair of resonator conductor patterns 14, and the via-hole 8 for making interlayer connection between the first wiring layer 25 and the second wiring layer 27 are collectively formed.

Figure 14:
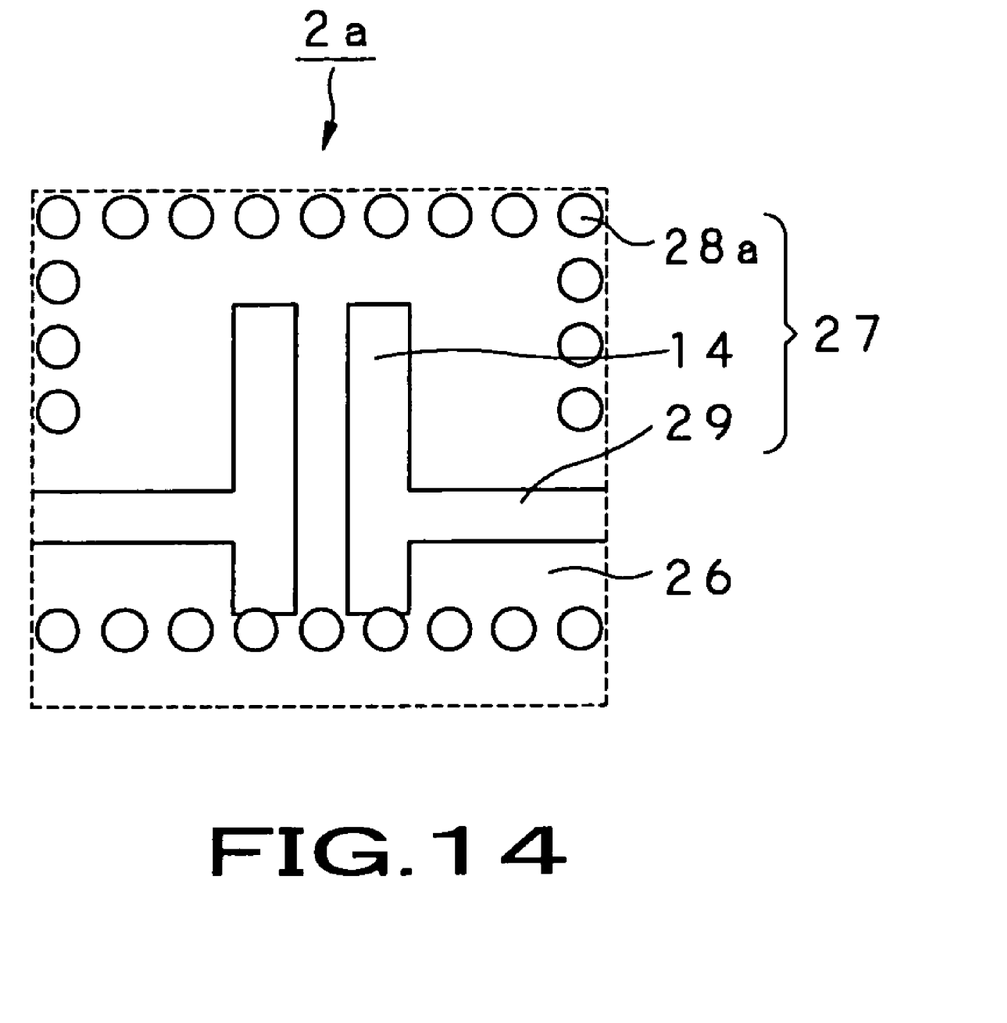
FIG. 14 is a plane view of essential parts for explaining the process of manufacturing the circuit board device, showing a pair of resonator conductor patterns exposed on a counter-surface.

In the second wiring layer 27, the pair of resonator conductor patterns 14 are linearly formed and arranged substantially parallel to each other so that they face each other in the direction of width, and feeder parts 29 are formed protruding in the direction opposite to the facing direction, from substantially central parts in the longitudinal direction of the pair of resonator conductor patterns 14, as shown in FIG. 14. In the second wiring layer 27, the pair of resonator conductor patterns 14 have a length that is substantially ¼ of the passing wavelength λ in the longitudinal direction. One end in the longitudinal direction of each resonator conductor pattern 14 is connected to the first shield part 28a and the other end is opened.

The surface of the second insulating layer 26 having the second wiring layer 27 embedded therein is a surface flattened with high accuracy by flattening processing, similarly to the first insulating layer 22. This surface becomes the counter-surface 2a where the pair of resonator conductor patterns 14 of the filter element 5 are exposed. In this embodiment, the wiring layers of the two-layer structure including the first wiring layer 25 and the second wiring layer 27 are used. However, the structure is not limited to this, and the process of forming the first insulating layer 22 and the first wiring layer 25 may be repeated to form three or more wiring layers.

Figure 15:
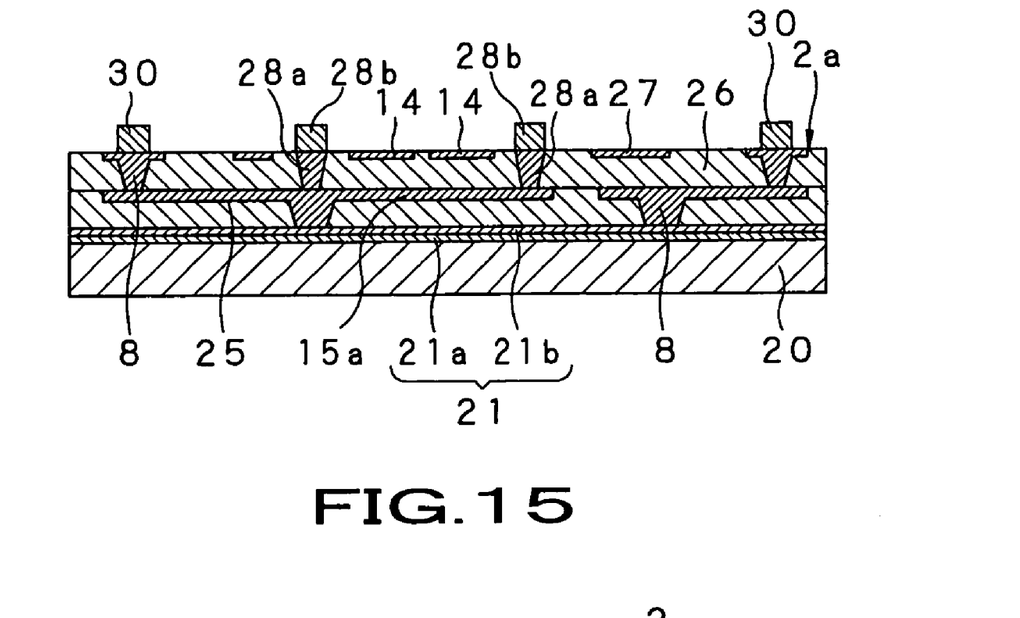
FIG. 15 is a longitudinal sectional view for explaining the process of manufacturing the circuit board device, showing the state where a second shield part and a bump part are formed on the second wiring layer.

Next, in the counter-surface 2a, a second shield part 28b, for example, made of solder, is formed on the exposed first shield part 28a, and a bump part 30 is similarly formed on the via-hole 8, as shown in FIG. 15. The second shield part 28b is electrically connected with the ground part 15b that is exposed on the mounting surface 4a of the base board 4 when the circuit part 2 is mounted on the base board 4, and the second shield part 28b thus shields the pair of resonator conductor patterns 14. The bump part 30 functions as an electric connection part in mounting the circuit part 2 on the base board 4 and may be formed as a nickel/copper plating layer, for example, using electroplating or electroless plating.

The circuit part 2 in which the pair of resonator conductor patterns 14 of the filter element 5 are arranged on the counter-surface 2a is thus formed. In the circuit part 2, the first insulating layer 22 and the second insulating layer 26 constitute the above-described plural insulating layers 6, and the first wiring layer 25 and the second wiring layer 27 constitute the above-described plural wiring layers 7.

Figure 16:
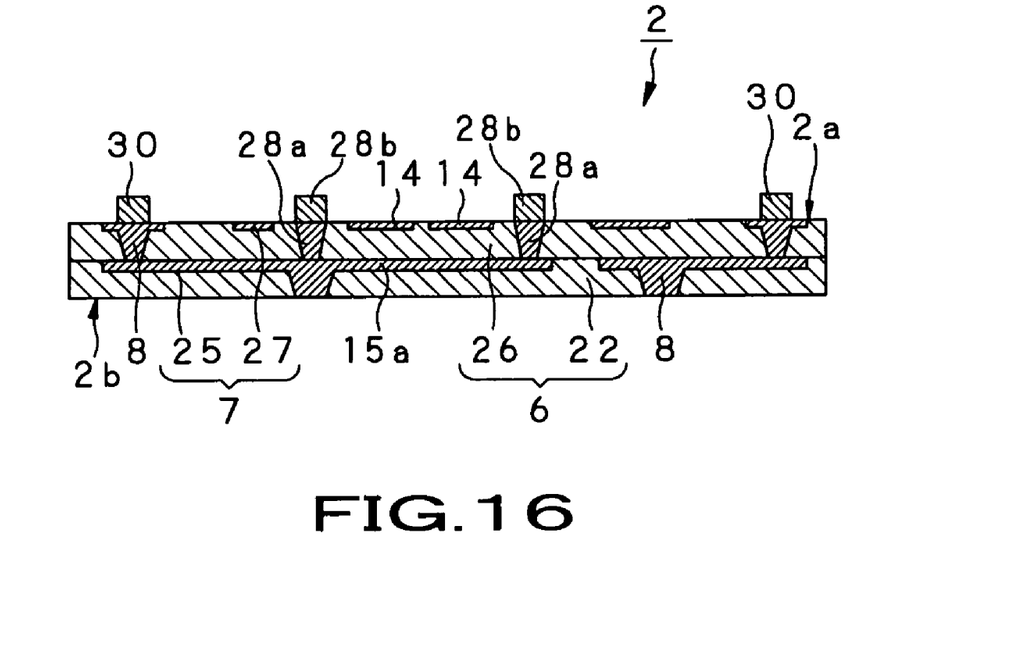
FIG. 16 is a longitudinal sectional view for explaining the process of manufacturing the circuit board device, showing a circuit part.

Next, the dummy board 20 is removed together with the peeling layer 21 from the circuit 2, as shown in FIG. 16. Specifically, the dummy board 20 and the peeling layer 21 together with the circuit part 2 are impregnated with an acid solution such as hydrochloric acid or nitric acid. The acid solution slightly dissolves the metal film 21a of the peeling layer 21 and enters between the metal film 21a and the resin film 21b. Thus, peeling between the metal film 21a and the resin film 21b proceeds. The dummy board 20 is removed in the state where the resin film 21b remains on the other major surface 2b on the side of the first insulating layer 22, of the circuit part 2. In this case, in the circuit part 2, a protection layer for protecting the second wiring layer 27 from the acid solution may be formed on the counter-surface 2a in advance. The dummy board 20 may also be removed from the circuit part 2, for example, by laser abrasion processing.

Next, the resin film 2b remaining on the other major surface 2b of the circuit part 2 is removed by a dry etching method, for example, using as oxygen plasma. This exposes the via-hole 8 on the other major surface 2b of the circuit part 2. Since the major surface of the dummy board 20 facing the other major surface 2b is highly flattened, the other major surface 2b of he circuit part 2 is highly flattened.

Figure 17:
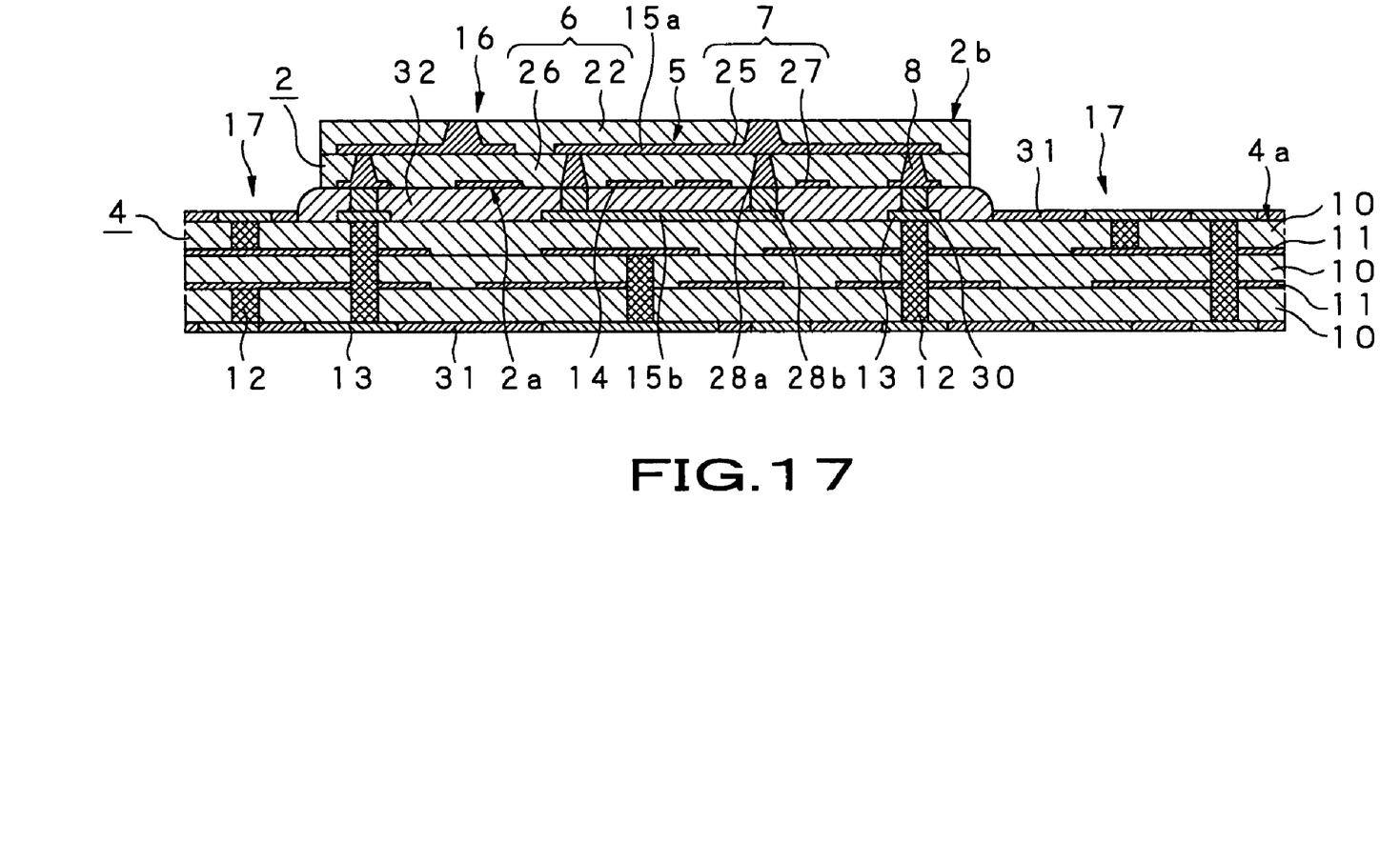
FIG. 17 is a longitudinal sectional view for explaining the process of manufacturing the circuit board device, showing a thick plate region and a thin plate region provided by mounting the circuit part on a base board.

Next, the circuit part 2 is mounted on the base board 4 in such a manner that the pair of resonator conductor patterns 14 exposed on the counter-surface 2a and the ground part 15b made up of a part of the input/output terminal parts 13 exposed on the mounting surface 4a of the base board 4 face each other, as shown in FIG. 17. The base board 4 has the plural wiring layers 11 having the ground or the like within the layers and the plural insulating layers 10. On the mounting surface 4a where the circuit part 2 is to be mounted, the input/output terminal parts 13 exposed from a protection layer 31 made of a resist or the like are formed, and the ground part 15b as a ground conductor to the pair of resonator conductor patterns 14 is formed at a position facing the filter element 5, on the mounting surface 4a.

As the circuit part 2 is electrically connected with the input/output terminals 13 exposed on the mounting surface 4a of the base board 4 via the bump parts 30, the circuit part 2 is mounted on the base board 4. Specifically, an underfiller 32 fills the space between the circuit part 2 and the base board 4 where the bump parts 30 and the input/output terminal parts 13 face each other. The bump parts 30 and the input/output terminal parts 13 are heated, for example, by a solder reflow method, and thus joined together. The circuit part 2 is thus mounted on the mounting surface 4a of the base board 4. At this point, the second shield part 28b is electrically connected with the ground part 15b. The junction between the bump parts 30 and the input/output terminal parts 13 is not limited to the solder reflow method. For example, contraction due to solidification of a resin material filled between the circuit part 2 and the base board 4 may be used for compression bonding.

Thus, in the base board 4, the part where the circuit part 2 is mounted on the mounting surface 4a is the thick plate region 16, and the part where the circuit part 2 is not mounted on the mounting surface 4a, that is, the part where the mounting surface 4a is exposed, is the thin plate region 17.

Figure 18:
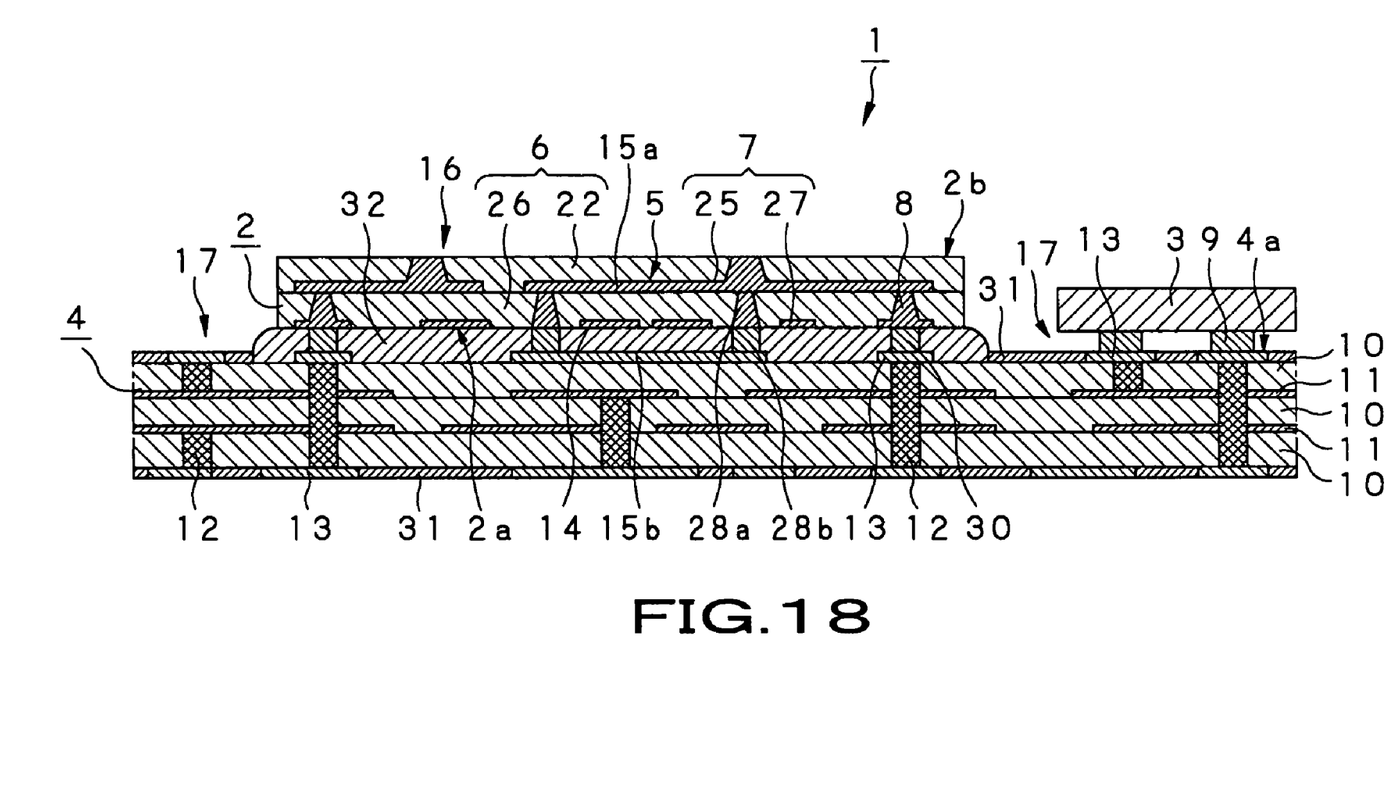
FIG. 18 is a longitudinal sectional view for explaining the process of manufacturing the circuit board device, showing the completed circuit board device.

Next, on the mounting surface 4a of the base board 4, the semiconductor component 3 such as a semiconductor chip or an LSI chip is mounted in the thin plate region 17, as shown in FIG. 18. This semiconductor component 3 is electrically connected with the mounting surface 4a of the base board 4 via the element bump part 9 by a flip-chip bonding method. The mounting the semiconductor component 3 is not limited to the flip-chip bonding method. For example, a phase down bonding method such as a tape automated bonding (TAB) method or a lead beam bonding method may be used.

In this manner, the semiconductor component 3 is mounted on the same plane as the circuit part 2 mounted on the mounting surface 4a of the base board 4, that is, parallel to the circuit part 2 on the base board 4. The circuit board device 1 is thus manufactured.

In the method for manufacturing the circuit board device 1 as described above, the semiconductor component 3 is mounted on the mounting surface 4a of the base board 4, that is, in the thin plate region 17, so that the semiconductor component 3 becomes parallel to the circuit part 2, and the semiconductor component 3 and the circuit part 2 are mounted on the base board 4 in such a manner that the whole body including the semiconductor component 3 has a small thickness. Therefore, the circuit board device 1 having a reduced thickness is provided.

In the method for manufacturing the circuit board device 1 according to the present invention, the pair of resonator conductor patterns 14 of the filter element 5 are formed in the inner layer of the thick plate region 16, that is, between the circuit part 2 and the base board 4, and the plural insulating layer 6 and 10 made of a dielectric insulating material are arranged above and below the filter element 5. Therefore, the pair of resonator conductor patterns 14 of the filter element 5 can be covered with the sufficiently thick dielectric insulating material, and the circuit board device 1 is provided in which deterioration in filter characteristic due to the thinning of the dielectric insulating material covering the pair of resonator conductor patterns 14 is prevented.

In this method for manufacturing the circuit board device 1, the circuit part 2, which is relatively expensive, is mounted only on a necessary part instead of the entire mounting surface 4a of the base board 4. Therefore, the circuit board device 1 of lower cost is provided.

Figure 19:
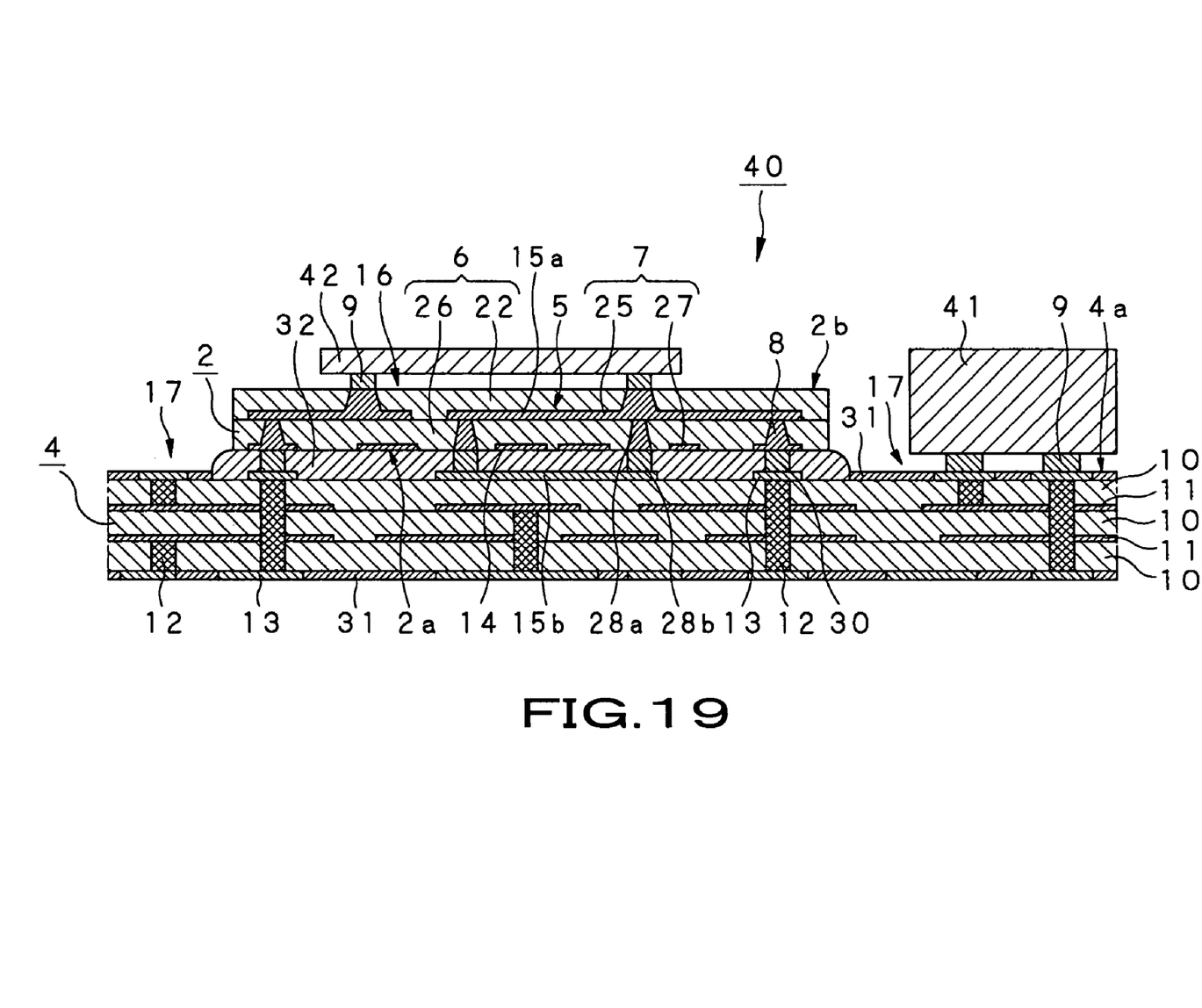
FIG. 19 is a longitudinal sectional view showing the state where a thick semiconductor component and a thin semiconductor component are mounted in the circuit board device.

In the above-described embodiment, the circuit board device 1 having the circuit part 2 and the semiconductor component 3 mounted parallel to each other on the mounting surface 4a of the base board 4 is described. However, the present invention is not limited to this and can also be applied to, for example, a circuit board device 40 having a structure as shown in FIG. 19. In FIG. 19, the same structural parts as those of the above-described circuit board device 1 are denoted by the same numerals and will not be described further in detail.

In this circuit board device 40, a thick semiconductor component 41 that is thicker than the circuit part 2 and a thin semiconductor component 42 that is thinner than the circuit part 2 are mounted. In this case, for example, the thick semiconductor component 41 can be mounted in the thin plate region 17 and the thin semiconductor component 42 can be mounted on the other major surface 2b of the circuit part 2. Thus, in the circuit board device 40, the thickness of the whole body can be reduced to realize reduction in thickness even when a thick and large semiconductor component is mounted.

In this embodiment, the filter element 5 of the tri-plate structure is arranged in the circuit board device 1, as described above. However, the filter element is not limited to this structure. For example, a filter element of a flat structure may also be used, and a coupler element, an antenna element, a capacitor element, a register element or an inductor element based on a lumped constant design, a register element may be used instead of the filter element.

While the invention has been described in accordance with a certain preferred embodiment thereof illustrated in the accompanying drawings and described in the above description in detail, it should be understood by those ordinarily skilled in the art that the invention is not limited to the embodiment, but various modifications, alternative constructions or equivalents can be implemented without departing from the scope and spirit of the present invention as set forth and defined by the appended claims.

INDUSTRIAL APPLICABILITY

As described above, according to the present invention, the filter element is arranged between the base board and the circuit part on the major surface of the base board and the semiconductor component is thus mounted immediately on the second region thinner than the thick first region. Therefore, the thickness of the whole circuit board device is reduced and miniaturization is realized.

Moreover, according to the present invention, the filter element is arranged inside the thick first region, that is, between the base board and the circuit part having the dielectric insulating layers, and the filter element can be covered with the sufficiently thick dielectric insulating layers. Therefore, the circuit board device is provided in which deterioration in filter characteristic due to the thinning of the dielectric insulating layers covering the filter element is prevented.

Furthermore, according to the present invention, the circuit part, which is relatively expensive, is mounted only on the necessary part instead of the entire surface of the base board. Therefore, reduction in cost of the circuit board device is realized.

The invention claimed is:

1. A circuit board device comprising:
   a base board having an insulating layer made of a dielectric insulating material and a ground plane made of a conductive material;
   a circuit part including a wiring layer and a dielectric insulating layer and mounted on a major surface of the base board;
   a filter element located at adjacent portions of the base board and the circuit part wherein the filter element includes conductive portions arranged on a major surface of the circuit part facing the base board
   a semiconductor component mounted on conductive portions at the major surface of the base board; and
   wherein the entire ground plane is co-planar with a level of said conductive portions.

2. A circuit board device comprising:
   a base board having an insulating layer made of a dielectric insulating material and a ground plane made of a conductive material;
   a circuit part including a wiring layer and a dielectric insulating layer and mounted on a major surface of the base board;
   a filter element located at adjacent portions of the base board and the circuit part;
   a semiconductor component mounted on conductive portions at the major surface of the base board; and
   wherein the entire ground plane is co-planar with a level of said conductive portions; and
   wherein the material used to form said insulating layer of said base board is different than the material used to form said insulating layer of said circuit part.

3. A method for manufacturing a circuit board device comprising the steps of:
   forming a base board having an insulating layer made of a dielectric insulating material and a ground plane made of a conductive material;
   forming a circuit part including a wiring layer and a dielectric insulating layer;
   mounting the circuit part on a major surface of the base board thereby forming a filter element; and
   mounting a semiconductor component on conductive portions on the major surface of the base board;
   wherein the entire ground plane is co-planar with a level of said conductive portions.

4. The method for manufacturing a circuit board device as claimed in claim 3, wherein at the element forming step, the filter element is formed as one of a band-pass filter, a band-stop filter, a low-pass filter, a high-pass filter, an antenna, and a direction coupler.

* * * * *